United States Patent
Ng et al.

(10) Patent No.: US 8,669,611 B2
(45) Date of Patent: Mar. 11, 2014

(54) APPARATUS AND METHOD FOR POWER MOS TRANSISTOR

(75) Inventors: Chun-Wai Ng, Hsin-Chu (TW);
Hsueh-Liang Chou, Jhubei (TW);
Po-Chih Su, New Taipei (TW);
Ruey-Hsin Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/546,506

(22) Filed: Jul. 11, 2012

(65) Prior Publication Data

US 2014/0015038 A1   Jan. 16, 2014

(51) Int. Cl.
*H01L 29/66* (2006.01)

(52) U.S. Cl.
USPC ............ 257/330; 257/328; 257/341; 257/367

(58) Field of Classification Search
USPC .................... 257/330, 328, 341, 367
See application file for complete search history.

(56) References Cited

U.S. PATENT DOCUMENTS

| 5,640,034 | A | * | 6/1997 | Malhi | 257/341 |
| 5,814,858 | A | * | 9/1998 | Williams | 257/328 |
| 6,251,730 | B1 | | 6/2001 | Luo | |
| 2002/0102795 | A1 | * | 8/2002 | Calafut | 438/259 |
| 2005/0128320 | A1 | | 6/2005 | Sakimura | |
| 2005/0191794 | A1 | * | 9/2005 | Herrick et al. | 438/135 |
| 2006/0030142 | A1 | * | 2/2006 | Grebs et al. | 438/618 |
| 2009/0140343 | A1 | * | 6/2009 | Feilchenfeld et al. | 257/367 |
| 2010/0006935 | A1 | * | 1/2010 | Huang et al. | 257/341 |

FOREIGN PATENT DOCUMENTS

| JP | 2002520851 | A | 7/2002 |
| KR | 20050058983 | | 6/2005 |
| WO | 0003427 | | 1/2000 |
| WO | 03096428 | A1 | 11/2003 |

* cited by examiner

*Primary Examiner* — Long K Tran
*Assistant Examiner* — Dzung Tran
(74) *Attorney, Agent, or Firm* — Slater & Matsil, L.L.P.

(57) ABSTRACT

A MOS transistor comprises a substrate, a first region formed over the substrate, a second region grown from the first region, a third region of formed in the second region, a first drain/source region formed in the third region, a first gate electrode formed in a first trench, a second drain/source region formed in the second region and on an opposite side of the first trench from the first drain/source region and a second trench coupled between the second drain/source region and the second region, wherein the second trench is of a same depth as the first trench.

15 Claims, 11 Drawing Sheets

APPARATUS AND METHOD FOR POWER MOS TRANSISTOR

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As semiconductor devices are scaled down, new techniques are needed to maintain the electronic components' performance from one generation to the next. For example, low gate-to-drain capacitance and low on resistance of transistors may be desirable for power applications.

As semiconductor technologies evolve, metal oxide semiconductor field effect transistors (MOSFET) have been widely used in today's integrated circuits. MOSFETs are voltage controlled devices. When a control voltage is applied to the gate a MOSFET and the control voltage is greater than the threshold of the MOSFET, a conductive channel is built between the drain and the source of the MOSFET. As a result, a current flows between the drain and the source of the MOSFET. On the other hand, when the control voltage is less than the threshold of the MOSFET, the MOSFET is turned off accordingly.

MOSFETs may include two major categories. One is n-channel MOSFETs; the other is p-channel MOSFETs. According to the structure difference, MOSFETs can be further divided into two sub-categories, namely trench power MOSFETs and lateral power MOSFETs. In an n-channel trench power MOSFET, a p-body region is employed to form a channel coupled between the source region formed over the p-body region and the drain region formed under the p-body region. Furthermore, in the trench power MOSFET, the drain and source are placed on opposite sides of a wafer. There may be a trench structure comprising a gate electrode formed between the drain and the source of the trench power MOSFET.

Trench power MOSFETs are commonly known as vertical power MOSFETs. Vertical power MOSFETs have widely used in high voltage and current applications due to their low gate drive power, fast switching speed and lower on resistance.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, a quasi-vertical power metal oxide semiconductor (MOS) transistor device. The embodiments of the disclosure may also be applied, however, to a variety of semiconductor devices. Hereinafter, various embodiments will be explained in detail with reference to the accompanying drawings.

Figure 1:
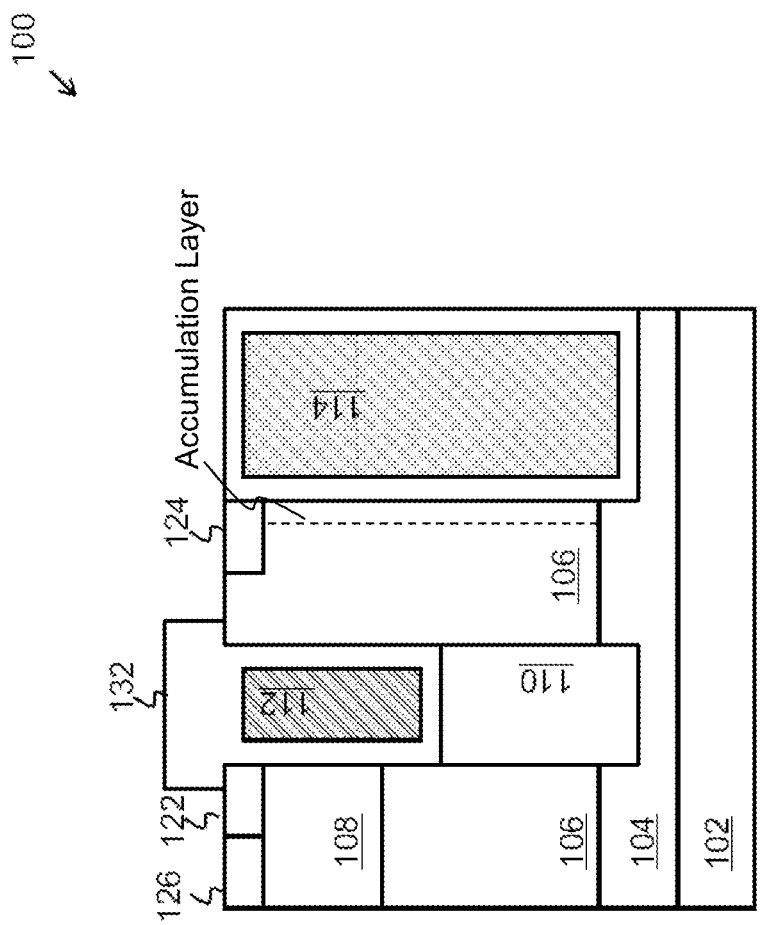
FIG. 1 illustrates a simplified cross-sectional view of a quasi-vertical trench MOS transistor in accordance with an embodiment.

FIG. 1 illustrates a simplified cross-sectional view of a quasi-vertical trench MOS transistor in accordance with an embodiment. The quasi-vertical trench MOS transistor 100 includes a substrate 102 with a first conductivity type. In accordance with an embodiment, the first conductivity type is P-type. The quasi-vertical trench MOS transistor 100 further includes an N-type buried layer (NBL) 104 formed over the substrate 102 and an N-type epitaxial layer 106 formed over the NBL layer 104. The quasi-vertical trench MOS transistor 100 further comprises a first trench comprising an oxide region 110 and a gate region 112. As shown in FIG. 1, the gate region 112 is formed over the oxide region 110. The quasi-vertical trench MOS transistor 100 may further comprise a P-type body (PB) region 108 formed in the N-type epitaxial layer 106, a P+ region 126, a first N+ region 122 and a second N+ region 124.

As shown in FIG. 1, the P+ region 126 and the first N+ region 124 are formed in the PB region 108. The second N+ region 124 is formed in the N-type epitaxial layer 106. In accordance with an embodiment, the first N+ region 122 is a source region of the quasi-vertical trench MOS transistor 100. The second N+ region 124 is a drain region of the quasi-vertical trench MOS transistor 100. The PB region 108 is a channel coupled between the source and drain of the quasi-vertical trench MOS transistor 100. As shown in FIG. 1, the first N+ region 122 and the second N+ region 124 are formed on opposite sides of the gate region 112. The second N+ region 124 functions as the drain region, which is coupled to the channel region (PB region 108) through the N-type epitaxial layer 106 and the NBL layer 104.

The quasi-vertical trench MOS transistor 100 comprises a second trench having a same depth as the first trench. In particular, the second trench comprises a deep trench 114 and an accumulation layer (not shown) formed along the sidewall of the deep trench 114. As shown in FIG. 1, the second trench is formed adjacent to the second N+ region 124. In accordance with an embodiment, the deep trench 114 may be electrically coupled to the gate region 112. When a gate control voltage is applied to the gate region 112 as well as the deep trench 114, the gate control voltage may attract majority carriers and generate the accumulation layer (not shown) along the sidewall of the deep trench 114. The accumulation layer may be of more majority carriers. As a result, a low resistance drain current conductive path is built between the NBL layer 104 and the second N+ region 124.

As shown in FIG. 1, despite that the N-type epitaxial layer 106 can carry the drain current from the NBL layer 104 to the second N+ region 124, the resistance of the N-type epitaxial layer 106 is higher than the accumulation layer formed along the sidewall of the deep trench 114. By employing an accumulation layer coupled between the second N+ region 124 and the NBL layer 104, the current transport is improved. In addition, by coupling the NBL layer 104 with the second N+ region 124, the drain current can be picked up from the NBL layer 104. As a result, the drain of the quasi-vertical trench MOS transistor 100 can be placed at the same side as the source.

One advantageous feature of the quasi-vertical MOS transistor 100 is that the quasi-vertical structure shown in FIG. 1 can be easily integrated into lateral fabrication processes. Another advantageous feature of the quasi-vertical MOS transistor 100 is that the accumulation layer formed along the sidewall of the second trench helps to provide a low on resistance channel for the drain current. As a result, the on resistance of the MOS transistor 100 is improved despite that a quasi-vertical structure is employed.

Figure 2:
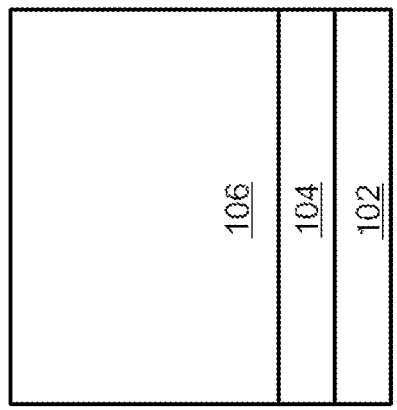
FIG. 2 illustrates a cross sectional view of a semiconductor device after an N-type epitaxial layer and an NBL layer are formed over a substrate in accordance with an embodiment.

FIGS. 2-11 illustrate intermediate steps of fabricating the quasi-vertical trench MOS transistor 100 shown in FIG. 1 in accordance with an embodiment. FIG. 2 illustrates a cross sectional view of a semiconductor device after an N-type epitaxial layer and an NBL layer are formed over a substrate in accordance with an embodiment. As shown in FIG. 2, the NBL layer 104 is formed over the P-type substrate 102. The N-type epitaxial layer 106 is formed over the NBL layer 104. It should be noted while FIG. 2 illustrates the conductivity of the substrate 102 is P-type, it is merely an example. The substrate 102 may be N-type. A person skilled in the art will recognize that the conductivity type of other layers may change in response to the conductivity type change of the substrate 102.

The substrate 102 may be formed of silicon, silicon germanium, silicon carbide or the like. Alternatively, the substrate 102 may be a silicon-on-insulator (SOI) substrate. The SOI substrate may comprise a layer of a semiconductor material (e.g., silicon, germanium and the like) formed over an insulator layer (e.g., buried oxide and the like), which is formed in a silicon substrate. Other substrates that may be used include multi-layered substrates, gradient substrates, hybrid orientation substrates and the like.

The NBL layer 104 may be formed by implanting N-type doping materials such as phosphorous or the like into the substrate 102. Alternatively, the NBL layer 104 can be formed by a diffusion process. In accordance with an embodiment, the NBL layer 104 is of a doping density in a range from about $10^{19}/cm^3$ to about $10^{20}/cm^3$.

The N-type epitaxial layer 106 is grown from the NBL layer 104. The epitaxial growth of the N-type epitaxial layer 106 may be implemented by using any suitable semiconductor fabrication processes such as chemical vapor deposition (CVD), ultra-high vacuum chemical vapor deposition (UHV-CVD) and the like. In accordance with an embodiment, the N-type epitaxial layer 106 is of a doping density in a range from about $10^{15}/cm^3$ to about $10^{18}/cm^3$.

Figure 3:
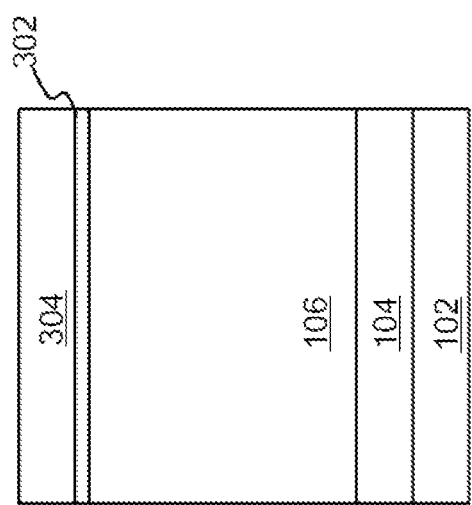
FIG. 3 illustrates a cross sectional view of the semiconductor device shown in FIG. 2 after a dielectric layer and a hard mask layer are formed over the substrate in accordance with an embodiment.

FIG. 3 illustrates a cross sectional view of the semiconductor device shown in FIG. 2 after a dielectric layer and a hard mask layer are formed over the substrate in accordance with an embodiment. The dielectric layer 302 may comprise an oxide layer. The dielectric layer 302 may be formed by any oxidation process, such as wet or dry thermal oxidation in an ambient environment comprising an oxide, $H_2O$, NO, or a combination thereof, or by CVD techniques using tetra-ethyl-ortho-silicate (TEOS) and oxygen as a precursor.

The hard mask layer 304 is deposited on the dielectric layer 302 in accordance with an embodiment. The hard mask layer 304 may be formed of silicon nitride. The hard mask layer 304 is deposited on top of the dielectric layer 302 through suitable fabrication techniques such as CVD and the like.

Figure 4:
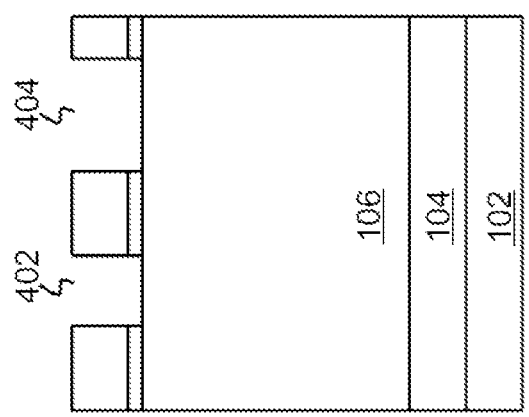
FIG. 4 illustrates a cross sectional view of the semiconductor device shown in FIG. 3 after suitable etching processes are applied to the dielectric layer and the hard mask layer in accordance with an embodiment.

FIG. 4 illustrates a cross sectional view of the semiconductor device shown in FIG. 3 after suitable etching processes are applied to the dielectric layer and the hard mask layer in accordance with an embodiment. The hard mask layer 304 and the dielectric layer 302 are patterned in consideration with the location of the first trench and second trench of the quasi-vertical power MOSFET 100 (shown in FIG. 1). Thereafter, an etching process, such as a reactive ion etch (RIE) or other dry etch, an anisotropic wet etch, or any other suitable anisotropic etch or patterning process, is performed to form the openings 402 and 404 shown in FIG. 4. It should be noted that in accordance with an embodiment, the width of the opening 404 is greater than the width of the opening 402.

Figure 5:
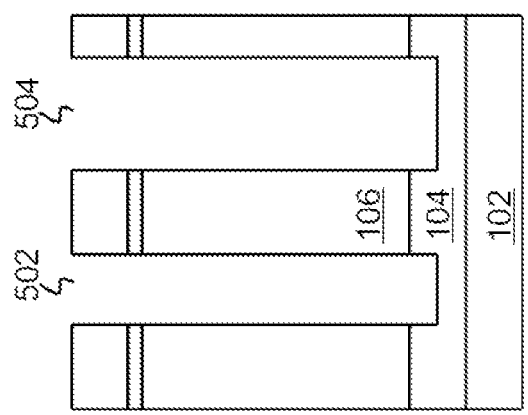
FIG. 5 illustrates a cross sectional view of the semiconductor device shown in FIG. 4 after etching processes are applied to the N-type epitaxial layer in accordance with an embodiment.

FIG. 5 illustrates a cross sectional view of the semiconductor device shown in FIG. 4 after etching processes are applied to the N-type epitaxial layer in accordance with an embodiment. An etching process, such as RIE, dry etch, wet etch, or any other suitable anisotropic etch techniques are applied to the N-type epitaxial layer 106 to form the trench 502 and the trench 504. As shown in FIG. 5, both the first trench 502 and the second trench 504 are formed in a same fabrication step. Such a single step formation of the first trench 502 and the second trench 504 helps to reduce the fabrication cost of the MOS transistor 100.

As shown in FIG. 5, the etching process may etch through the N-type epitaxial layer 106 and partially etch the NBL layer 104. Moreover, FIG. 5 illustrates that the depth of the first trench 502 is approximately equal to the depth of the second trench 504. It should be noted that as shown in FIG. 5, the width of the second trench 504 is greater than the width of the first trench 502. The relatively larger opening of the second trench 504 helps to maintain an opening during a subsequent oxide deposition process. The oxide deposition process will be described in detail below with respect to FIG. 6.

Figure 6:
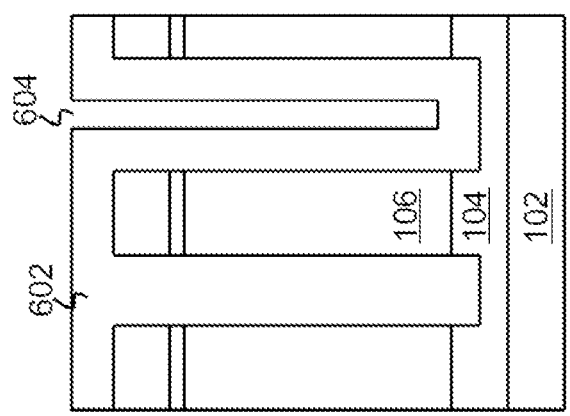
FIG. 6 illustrates a cross sectional view of the semiconductor device shown in FIG. 5 after an oxide deposition process is applied to the first trench and the second trench in accordance with an embodiment.

FIG. 6 illustrates a cross sectional view of the semiconductor device shown in FIG. 5 after a dielectric deposition process is applied to the first trench and the second trench in accordance with an embodiment. As shown in FIG. 6, a dielectric layer 602 fills the first trench 502 (shown in FIG. 5), but partially fills the second trench 504. There may be an opening 604 in the second trench 504 after the dielectric deposition process. As described above with respect to FIG. 5, the width of the second opening 504 is greater than the width of the first opening 502. As a result, by controlling the dielectric deposition process, the dielectric layer 602 may partially fill the second trench 504.

In accordance with an embodiment, the dielectric layer 602 may be formed of oxide. Throughout the description, the dielectric layer 602 may be alternatively referred to as the oxide layer 602. The oxide layer 602 may be formed by using suitable thermal treatment techniques, wet treatment techniques or deposition techniques such as PVD, CVD, ALD or the like. It should be noted that the oxide layer 602 shown in FIG. 6 is merely an example. Other dielectric materials such as such as nitrides, oxynitrides, high-k materials, combinations thereof, and multi-layers thereof may be alternatively used.

Figure 7:
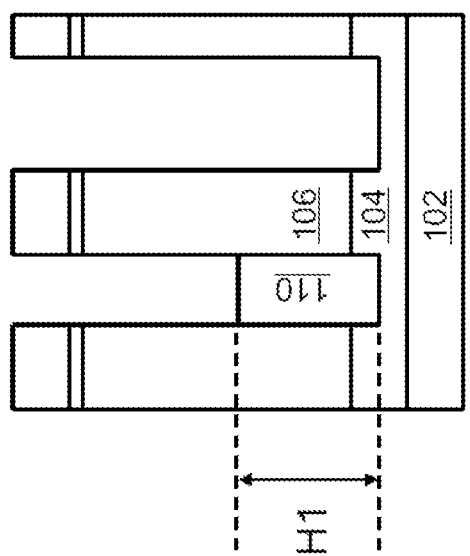
FIG. 7 illustrates a cross sectional view of the semiconductor device shown in FIG. 6 after an etching process is applied to the oxide layer in accordance with an embodiment.

FIG. 7 illustrates a cross sectional view of the semiconductor device shown in FIG. 6 after an etching process is applied to the oxide layer in accordance with an embodiment. An etching process, such as a RIE, an anisotropic wet etch, or any other suitable anisotropic etch process, is performed to remove the upper portion of the oxide layer in the first trench to form the oxide layer 110 shown in FIG. 7.

Moreover, the etching process is so controlled that the oxide layer in the second trench is fully removed. In other words, the second trench is free from oxide. In accordance with an embodiment, the oxide layer 110 shown in FIG. 7 is of a thickness H1. H1 is in a range from about 0.5 um to about 5 um. It should be noted that the dimensions recited through the description are merely examples, and may be changed to different values. It should further be noted that the oxide layer 110 shown in FIG. 7 may function as a field plate, which helps to reduce the surface electrical field. Furthermore, the reduced surface electrical field along the oxide layer 110 may improve the voltage rating of the MOS transistor 100.

Figure 8:
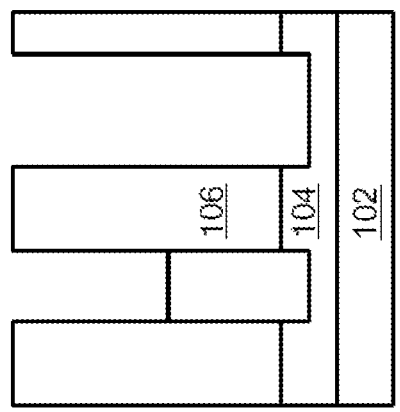
FIG. 8 illustrates a cross sectional view of the semiconductor device shown in FIG. 7 after a hard mask removal process is applied to the top surface of the semiconductor device in accordance with an embodiment.

FIG. 8 illustrates a cross sectional view of the semiconductor device shown in FIG. 7 after a hard mask removal process is applied to the top surface of the semiconductor device in accordance with an embodiment. As shown in FIG. 8, the hard mask layer and the oxide layers shown in FIG. 7 have been removed through a suitable hard mask layer removal process such as a wet etch process. The removal process is applied to the top surface of the semiconductor device until the N-type epitaxial layer 106 is exposed.

Figure 9:
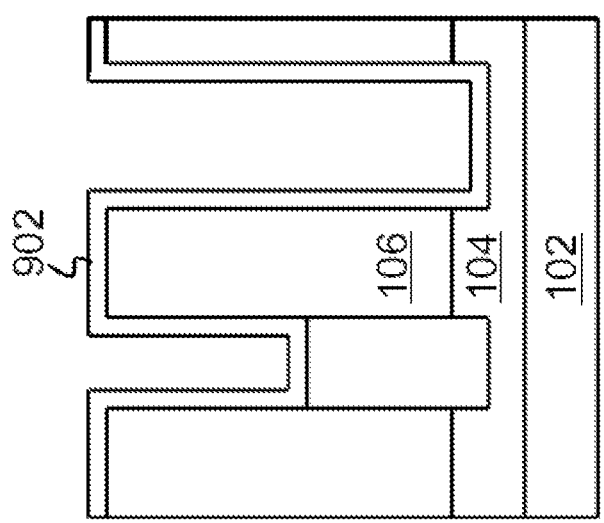
FIG. 9 illustrates a cross sectional view of the semiconductor device shown in FIG. 8 after a gate dielectric layer is formed in the trench in accordance with an embodiment.

FIG. 9 illustrates a cross sectional view of the semiconductor device shown in FIG. 8 after a gate dielectric layer is formed in the trench in accordance with an embodiment. As shown in FIG. 9, the gate dielectric layer 902 is formed in the first trench as well as the second trench. The gate dielectric layer 902 may be formed of commonly used dielectric materials such as oxides, nitrides, oxynitrides, high-k materials, combinations thereof, and multi-layers thereof.

In accordance with an embodiment, the gate dielectric layer 902 is an oxide layer. The gate dielectric layer 902 may be formed by using suitable thermal treatment techniques, wet treatment techniques or deposition techniques such as PVD, CVD, ALD or the like.

Figure 10:
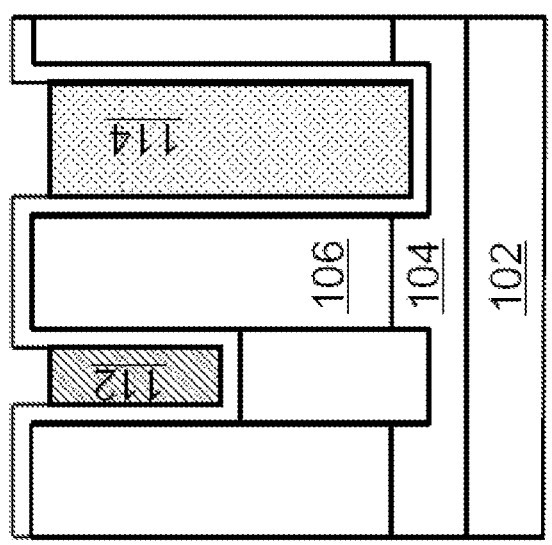
FIG. 10 illustrates a cross sectional view of the semiconductor device shown in FIG. 9 after a gate electrode layer is formed in the trench in accordance with an embodiment.

FIG. 10 illustrates a cross sectional view of the semiconductor device shown in FIG. 9 after a gate electrode layer is formed in the trench in accordance with an embodiment. The gate region 112 and the deep trench 114 may be filled with the same material through the same fabrication process.

The gate region 112 and the deep trench 114 may comprise a conductive material, such as a metal material (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped polycrystalline silicon, other conductive materials, or a combination thereof. In accordance with an embodiment, amorphous silicon is deposited and recrystallized to create poly-crystalline silicon (poly-silicon).

In accordance with an embodiment, the gate region 112 and the deep trench 114 may be formed of poly-silicon. The gate region 112 and the deep trench 114 may be formed by depositing doped or undoped poly-silicon by low-pressure chemical vapor deposition (LPCVD). In accordance with another embodiment, the gate region 112 and the deep trench 114 is formed of metal materials such as titanium nitride, tantalum nitride, tungsten nitride, titanium, tantalum and/or combinations. The metal gate electrode layer may be is formed using suitable deposition techniques such as ALD, CVD, PVD and the like. The above deposition techniques are well known in the art, and hence are not discussed herein.

Figure 11:
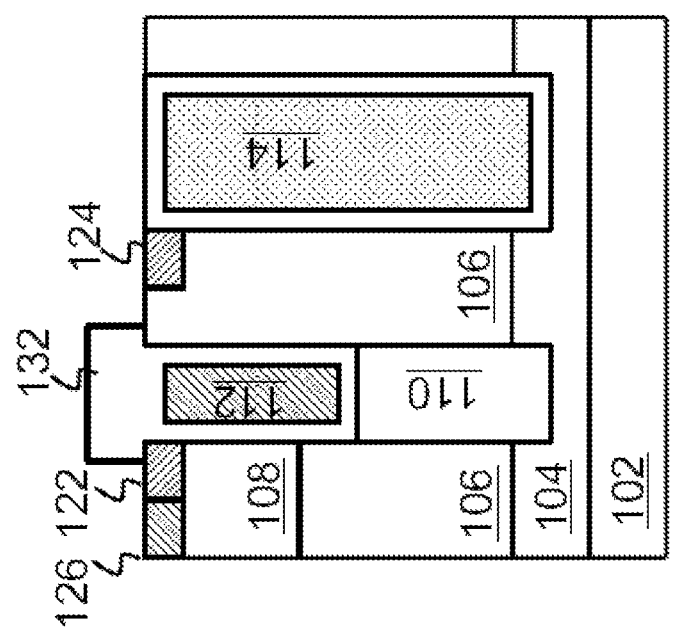
FIG. 11 illustrates a cross sectional view of the semiconductor device shown in FIG. 10 after a variety of ion implantation processes are applied to the top surface of the semiconductor device in accordance with an embodiment.

FIG. 11 illustrates a cross sectional view of the semiconductor device shown in FIG. 10 after a variety of ion implantation processes are applied to the top surface of the semiconductor device in accordance with an embodiment. As shown in FIG. 11, the PB region 108 is formed in the N-type epitaxial layer 106. In accordance with an embodiment, the PB region is of a doping concentration in a range from about $10^{16}/cm^3$ and about $10^{18}/cm^3$. The P+ region 126 may be formed by implanting a p-type dopant such as boron at a concentration of between about $10^{19}/cm^3$ and about $10^{20}/cm^3$.

The first N+ region 122 is formed over the PB region 108. In accordance with an embodiment, the first N+ region 122 functions as the source of the MOS transistor 100. The source region may be formed by implanting an n-type dopant such as phosphorous at a concentration of between about $10^{19}/cm^3$ and about $10^{20}/cm^3$. Furthermore, a source contact (not shown) may be formed over the first N+ region 122.

The second N+ region 124 is formed in the N-type epitaxial layer. In accordance with an embodiment, the second N+ region 124 may be the drain of the MOS transistor 100. The drain region may be formed by implanting an n-type dopant such as phosphorous at a concentration of between about $10^{19}/cm^3$ and about $10^{20}/cm^3$. As shown in FIG. 1, the drain region is formed on the opposite side from the source (the first N+ region 122).

The P+ region 126 may be formed by implanting a p-type dopant such as boron at a concentration of between about $10^{19}/cm^3$ and about $10^{20}/cm^3$. The P+ region 126 may contact the p-type body of the MOS transistor 100. In order to eliminate the body effect, the P+ region 126 may be coupled to the first N+ region 122 (the source of the MOS transistor 100) directly through the source contact (not shown).

An inter-layer dielectric (ILD) layer (not shown) is formed over the top surface of the semiconductor device shown in FIG. 11. The ILD layer may be formed of silicon nitride doped silicate glass, although other materials such as boron doped phosphor silicate glass or the like may alternatively be utilized. Contact openings (not shown) may be formed in the ILD layer through an etching process. After the etching process, a portion of the ILD layer remains and becomes a gate-to-source dielectric layer 132. In addition, conductive materials are deposited into the opening to form the source contact (not shown).

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:
    a substrate of a first conductivity;
    a first region of a second conductivity formed over the substrate;
    a second region of the second conductivity grown from the first region;
    a third region of the first conductivity formed in the second region;
    a first drain/source region of the second conductivity formed in the third region;
    a first trench comprising:
        a dielectric layer formed in a bottom portion of the first trench; and
        a gate region formed in an upper portion of the first trench;
    a second drain/source region of the second conductivity formed in the second region and on an opposite side of the first trench from the first drain/source region; and
    a second trench coupled between the second drain/source region and the second region, wherein the second trench is of a same depth as the first trench.

2. The semiconductor device of claim 1, wherein a width of the second trench is greater than a width of the first trench.

3. The semiconductor device of claim 1, wherein the second trench is configured to generate an accumulation layer along sidewalls of the second trench.

4. The semiconductor device of claim 1, wherein the first region is a buried layer.

5. The semiconductor device of claim 1, wherein the second region is an epitaxial layer.

6. The semiconductor device of claim 1, wherein the third region is a body region.

7. The semiconductor device of claim 1, further comprising:
    a fourth region having the first conductivity formed in the third region, wherein the fourth region is coupled to the first drain/source region.

8. The semiconductor device of claim 1, wherein the gate region is coupled to the second trench.

9. The semiconductor device of claim 1, wherein the dielectric layer comprises an oxide.

10. The semiconductor device of claim 1, wherein:
    the first drain/source region is a source; and
    the second drain/source region is a drain.

11. A device comprising:
    a first drain/source region having a first conductivity;
    a first gate formed in a first trench, wherein the first trench comprises a dielectric layer formed underneath the first gate;
    a second drain/source region having the first conductivity, wherein the first drain/source region and the second drain/source region are formed on opposite sides of the first gate; and
    a second trench, wherein:
        the second trench is of a same depth as the first trench; and
        the second trench and the first trench are formed on opposite sides of the second drain/source region.

12. The device of claim 11, further comprising:
    a substrate of a second conductivity;
    a first region of the first conductivity formed over the substrate;
    a second region of the first conductivity grown from the first region, wherein the second drain/source region is formed in the second region; and
    a third region of the second conductivity formed in the second region, wherein the first drain/source region is formed in the third region.

13. The device of claim 12, further comprising:
    a body region having the second conductivity, wherein the body region is coupled to the first drain/source region.

14. The device of claim 11, wherein the first gate comprises:
    a first gate dielectric layer formed in the first trench, wherein the first gate dielectric layer is formed over sidewalls of the first trench and an upper surface of the dielectric layer; and
    a first gate electrode formed over the first gate dielectric layer.

15. The device of claim 11, wherein the second trench comprises polysilicon.

* * * * *